(12) United States Patent
Neumann et al.

(10) Patent No.: US 8,854,809 B2
(45) Date of Patent: Oct. 7, 2014

(54) MODULAR DATA CENTER

(75) Inventors: Matthew Daniel Neumann, Roseville, CA (US); Timothy Michael Rau, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 10 days.

(21) Appl. No.: 13/387,092

(22) PCT Filed: Mar. 22, 2010

(86) PCT No.: PCT/US2010/028174
§ 371 (c)(1),
(2), (4) Date: Jan. 25, 2012

(87) PCT Pub. No.: WO2011/119143
PCT Pub. Date: Sep. 29, 2011

(65) Prior Publication Data
US 2013/0044426 A1 Feb. 21, 2013

(51) Int. Cl.
*H05K 7/20* (2006.01)
*E04H 1/00* (2006.01)
*E04H 3/00* (2006.01)
*E04H 5/00* (2006.01)
*E04H 6/00* (2006.01)
*E04H 9/00* (2006.01)
*E04H 14/00* (2006.01)
*F25B 45/00* (2006.01)
*G05D 23/00* (2006.01)
*G06F 1/20* (2006.01)
*H05K 5/00* (2006.01)
*H05K 7/14* (2006.01)
*H05K 5/02* (2006.01)

(52) U.S. Cl.
CPC ............ *H05K 7/1497* (2013.01); *H05K 5/0004* (2013.01); *G06F 1/20* (2013.01); *H05K 7/14* (2013.01); *G06F 2200/201* (2013.01); *H05K 7/2049* (2013.01); *H05K 7/1488* (2013.01); *H05K 7/20254* (2013.01); *H05K 5/02* (2013.01); *H05K 7/2039* (2013.01); *G06F 1/206* (2013.01); *H05K 7/1485* (2013.01); *H05K 7/20409* (2013.01); *H05K 5/00* (2013.01)
USPC ....... 361/679.54; 361/709; 361/688; 361/689; 52/79.1; 52/79.6; 52/79.7; 52/79.8; 52/234; 62/77; 700/299; 700/300

(58) Field of Classification Search
CPC ..... H05K 7/14; H05K 7/1485; H05K 7/1488; H05K 7/1495; H05K 7/1497; H05K 7/18; H05K 7/20254; H05K 7/2039; H05K 7/20409; H05K 5/00; H05K 5/02; H05K 5/0004; G06F 1/206
USPC .............. 361/679.54, 709, 688, 689; 52/79.1, 52/79.6–79.8, 234; 211/26; 62/77; 700/276, 298, 299, 300
See application file for complete search history.

(56) References Cited

U.S. PATENT DOCUMENTS 6,829,145 B1 * 12/2004 Corrado et al. ............... 361/704
7,278,273 B1 10/2007 Whitted et al.
(Continued)

FOREIGN PATENT DOCUMENTS

JP 09162580 6/1997
KR 10-2001-0077061 8/2001
(Continued)

*Primary Examiner* — Anthony Haughton
*Assistant Examiner* — Zhengfu Feng

(57) ABSTRACT

A data center includes a modular building structure forming an enclosure having a bottom side. An external support system extends from the modular building structure. A series of heat sinks are each configured to extend from an interior to an exterior of the enclosure and protrude below the bottom side of the modular building structure into a fluid. Electronic components and devices are housed within the enclosure.

16 Claims, 3 Drawing Sheets

(56) References Cited

U.S. PATENT DOCUMENTS

| | | |
|---|---|---|
| 7,525,207 B2 | 4/2009 | Clidaras et al. |
| 2003/0147214 A1 | 8/2003 | Patel et al. |
| 2007/0139883 A1 | 6/2007 | Pinkerton, III et al. |
| 2008/0205003 A1 | 8/2008 | Belady |
| 2008/0209234 A1* | 8/2008 | Clidaras et al. ............... 713/300 |
| 2009/0229194 A1 | 9/2009 | Armillas |
| 2010/0051563 A1* | 3/2010 | Schreiber ..................... 211/26 |

FOREIGN PATENT DOCUMENTS

| | | |
|---|---|---|
| KR | 20-0443588 | 2/2009 |
| WO | WO-2008/131041 | 10/2008 |

\* cited by examiner

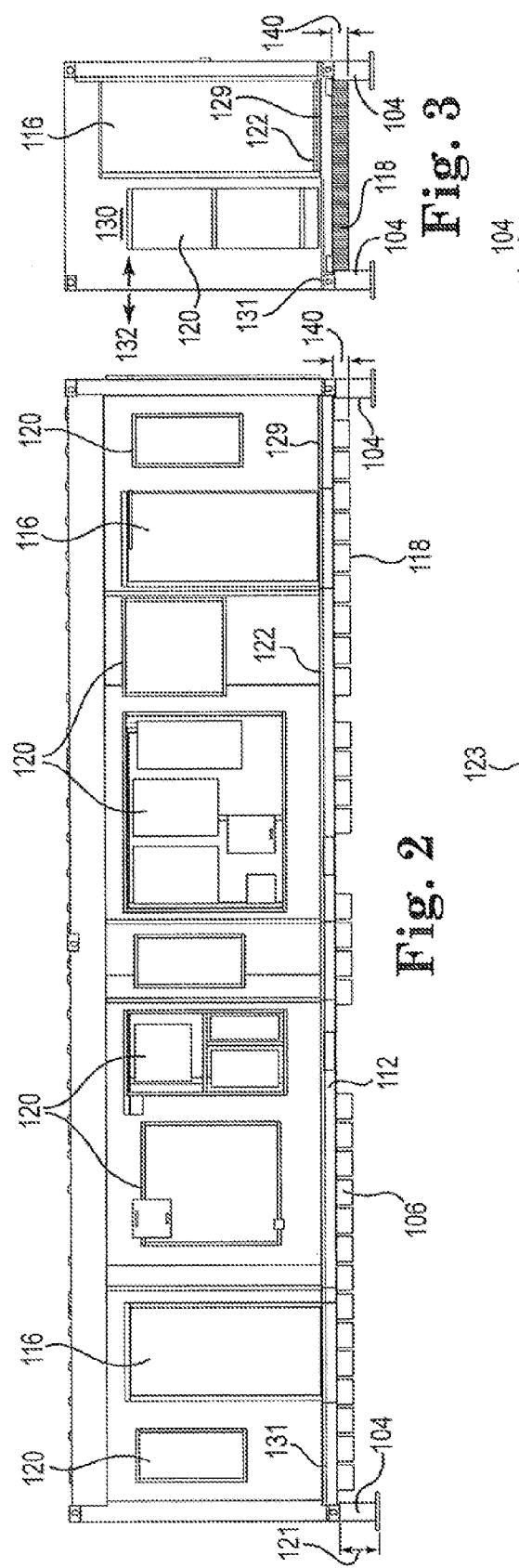
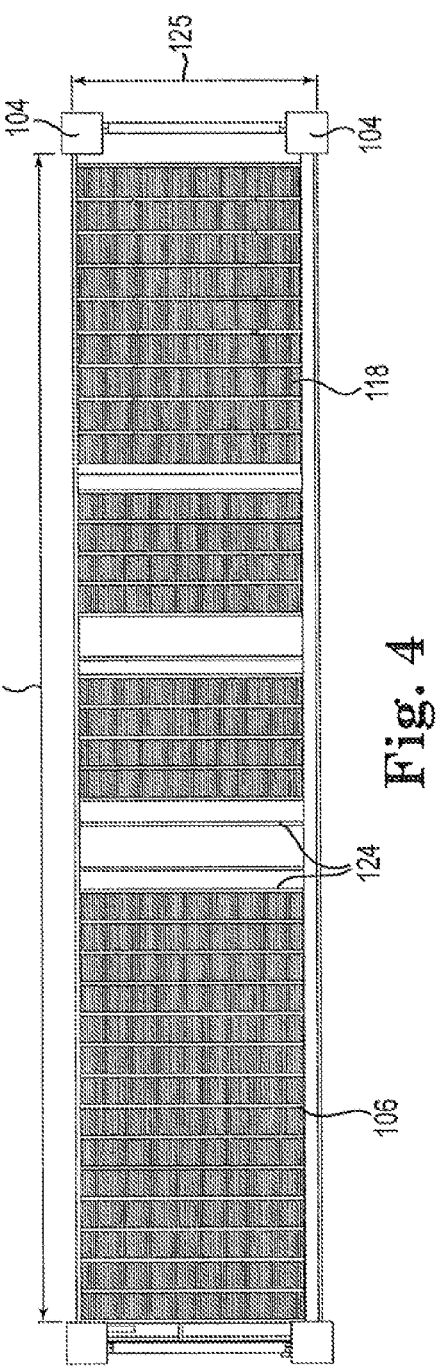
Fig. 2
Fig. 3
Fig. 4

MODULAR DATA CENTER

BACKGROUND

A typical data center includes numerous computer systems which together generate substantial heat during operation. This generated heat is undesirable as processors in the computer systems typically work more efficiently and have a lower failure rate at lower temperatures. Data centers can employ massive cooling systems in order to maintain the correct operating temperature range of the server related equipment. These cooling systems are typically very expensive and include large amounts of infrastructure. Previous cooling solutions include floating data centers and closed loop fluid cooling systems. Additionally, previous modular data centers have used conventional air conditioning systems.

For these and other reasons, a need exists for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 is a cross-sectional view of the modular data center embodiment of FIG. 1 taken along lines 2-2.

FIG. 3 is a cross-sectional view of the modular data center embodiment of FIG. 1 taken along lines 3-3.

FIG. 4 is a bottom view of the modular data center embodiment of FIG. 1.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
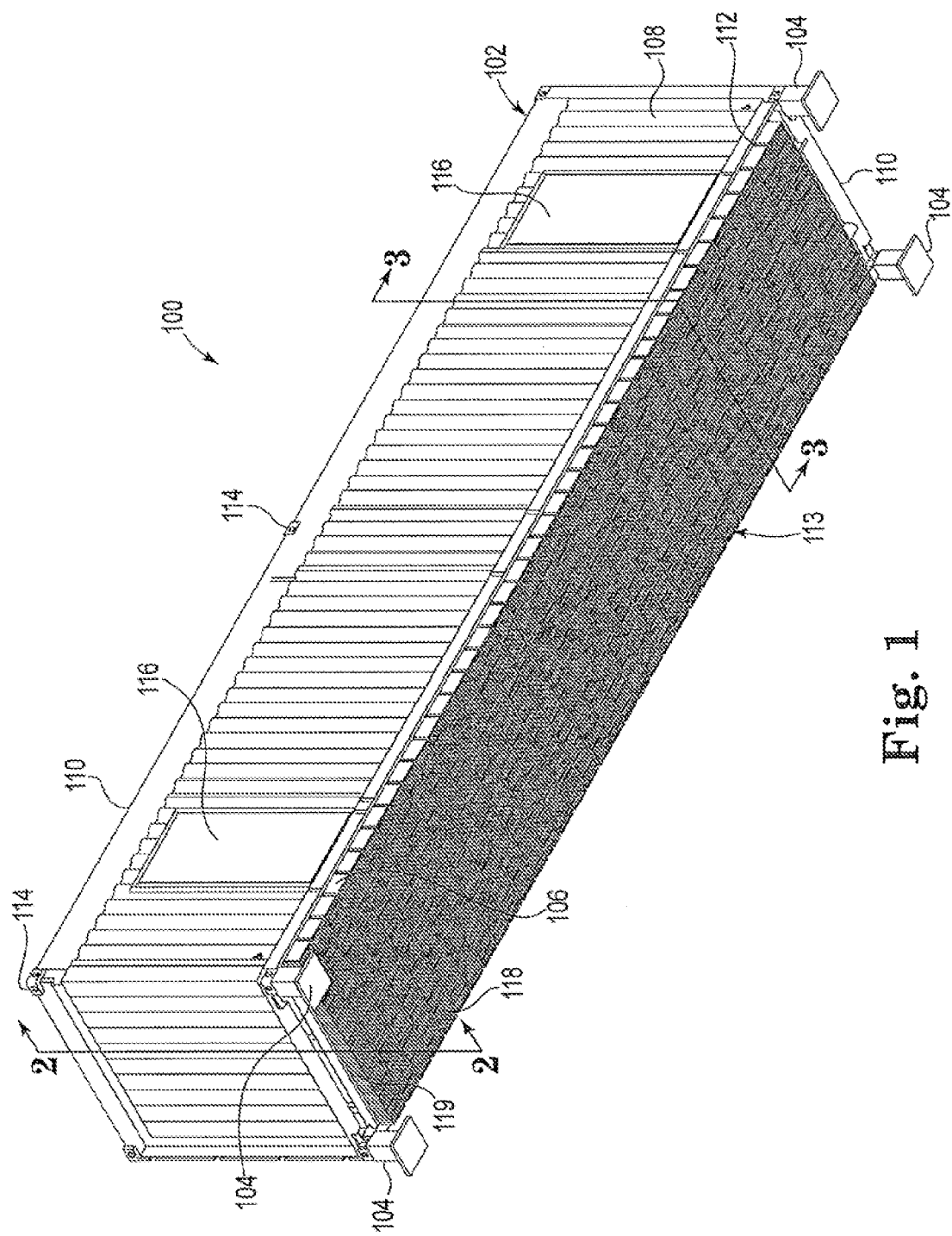
FIG. 1 is a profile view of a modular data center according to one embodiment.

FIG. 1 is a profile view of one embodiment of a modular data center 100. Modular data center 100 includes a modular building structure 102, a support system 104, and heat sinks 106. In one embodiment, modular building structure 102 includes a shell enclosure 108 constructed around a structural frame 110. In one embodiment, shell enclosure 108 comprises corrugated steel and structural frame 110 comprises structural steel, although other suitable materials (e.g., aluminum) as well as other suitable construction compositions can be used. Modular building structure 102 includes a bottom 112 to which heat sinks 106 are attached. In one embodiment, bottom 112 comprise steel, fiberglass, polyvinyl chloride (PVC) or other suitable material.

Modular building structure 102 forms an enclosure which houses equipment 120, shown in FIGS. 2 and 3. In one embodiment modular building structure 102 is a modular, stand-alone, self sufficient unit. In one example embodiment, modular building structure 102 is a standard freight container. Modular building structure 102 is sized and configured to properly house electronic information technology (IT) equipment 120 and be suitable for the environment(s) in which the data center 100 will be deployed. Embodiments of modular building structure 102 include insulated and non-insulated insulated structures.

Modular building structure 102 includes one or more doors 116 which provide accessibility for personal and equipment. In the illustrated embodiment, modular building structure 102 includes lifting eyes 114 to facilitate shipping, placement, and removal of the data center 100. In one embodiment, modular data center 100 is connectable to additional modular data centers such as through side-to-side or end-to-end attachment.

In one embodiment, modular building structure 102 is water/fluid tight and suitable to be at least partially submerged. In one embodiment, bottom 112 of modular building structure 102 is waterproof and submersible. In one embodiment, heat sinks 106 are assembled in bottom 112 with a fin side 118 protruding exteriorly below bottom 112. In one embodiment, heat sinks 106 are sealable within bottom 112 and maintain a fluid tight assembly 113 which includes heat sinks 106 and bottom 112. In one embodiment, heat sinks 106 are suitable for submersion in water or other suitable cooling fluid. Heat sinks 106 comprise a suitable heat conducting and non-corrosive material.

FIGS. 2 and 3 provide cross-sectional views of the modular data center 100 according to the embodiment of FIG. 1. As illustrated, modular building structure 102 houses various types of electronic IT equipment 120 such as computer servers, other computer systems, network area storage devices, data communication routers and switches, the electronic support equipment to make them operational (e.g., electrical switch boards, and other electronic equipment). In one embodiment, electronic IT equipment 120 is rack mounted, although other suitable mounting, such as cabinet mounting, can also be used. Modular building structure 102 is configured to provide a secure and stable environment for electronic IT equipment 120 to operate.

In one embodiment, support system 104 of modular data center 100 is fixedly secured to modular building structure 102. In another embodiment, support system 104 is removable for shipping and/or interchangeable replacement. In one embodiment, support system 104 includes at least one footing or leg protruding below bottom 112 which is suitable to support data center 100 on an underlying ground structure. In one embodiment, the at least one footing of support system 104 is adjustable and extendable to a desired distance indicated by arrows 121, from bottom 112 to thereby maintain modular building structure 102 at a desired height above the underlying ground structure. In another embodiment, the at least one footing of support system 104 is extended at a predetermined distance, indicated by arrows 121, from bottom 112 to thereby maintain modular building structure 102 at a predetermined height.

In one embodiment, support system 104 includes tubular, angular, or l-shaped members and base plates for load distribution and stability. In the embodiments, support system 104 is a cable system, buoyant float system, or other suitable system. Support system 104 is an external support system for modular data center 100 such that heat sinks 106 extending below bottom 112 do not structurally support modular data center 100. Additionally, in one embodiment, support system 104 is formed of materials which are non-corrosive (e.g., stainless steel or galvanized steel) or include a non-corrosive coating (e.g., rubber membrane).

FIG. 4 is a bottom view of modular data center 100 according to the embodiment of FIG. 1. In one embodiment, heat sinks 106 are assembled in a series along a length indicated by arrows 123 of bottom 112. In one embodiment, heat sinks 106 extend a width, indicated by arrows 125, of modular data center 100 and installed in a parallel series. In one illustrative suitable example embodiment, modular data center 100 comprises a series of 33 heat sinks 106, each measuring 84 inches wide by 10½ inches deep by 12 inches tall. In one embodiment, heat sinks 106 include straight fins 119 on fin side 118. In one embodiment, heat sinks 106 are staggered along bottom 112. In one embodiment, heat sinks 106 are removable and replaceable. Select heat sinks 106 are not illustrated in FIG. 4 to illustrate framing members 124. Framing members 124 (e.g., angles, channels or rails) are configured in bottom 112 and provide support for heat sinks 106. In one embodiment, heat sinks 106 are sealable within bottom 112 using gaskets, adhesives, welds, bolts, clamping mechanisms, or other suitable devices. Embodiments of heat sinks 106 are formed of copper, aluminum, aluminum alloy or other suitable heat conducting and non-corrosive material.

Referring to FIGS. 2 and 3, in one embodiment, a top surface 122 of heat sinks 106 together forms a flat surface forming a floor assembly 129 within an interior 130 of modular data center 100. In one embodiment, top surface 122 of heat sinks 106 together form a cold plate 131 to absorb heat generated by the various heat generating electronic IT components 120 on the interior 130 of modular data center 100. In one embodiment, a separate internal cold plate is thermally coupled to heat sinks 106. In one embodiment, rack level cooling solutions connect with cold plate 131 to provide rack level cooling. Heat sinks 106 extend from interior 130 to an exterior 132 of modular data center 100. Heat sinks 106, in one embodiment, extend below bottom 112 to the exterior 132 a depth less indicated by arrows 140, than the height of the external supporting system 104 indicated by arrows 121.

Figure 5:
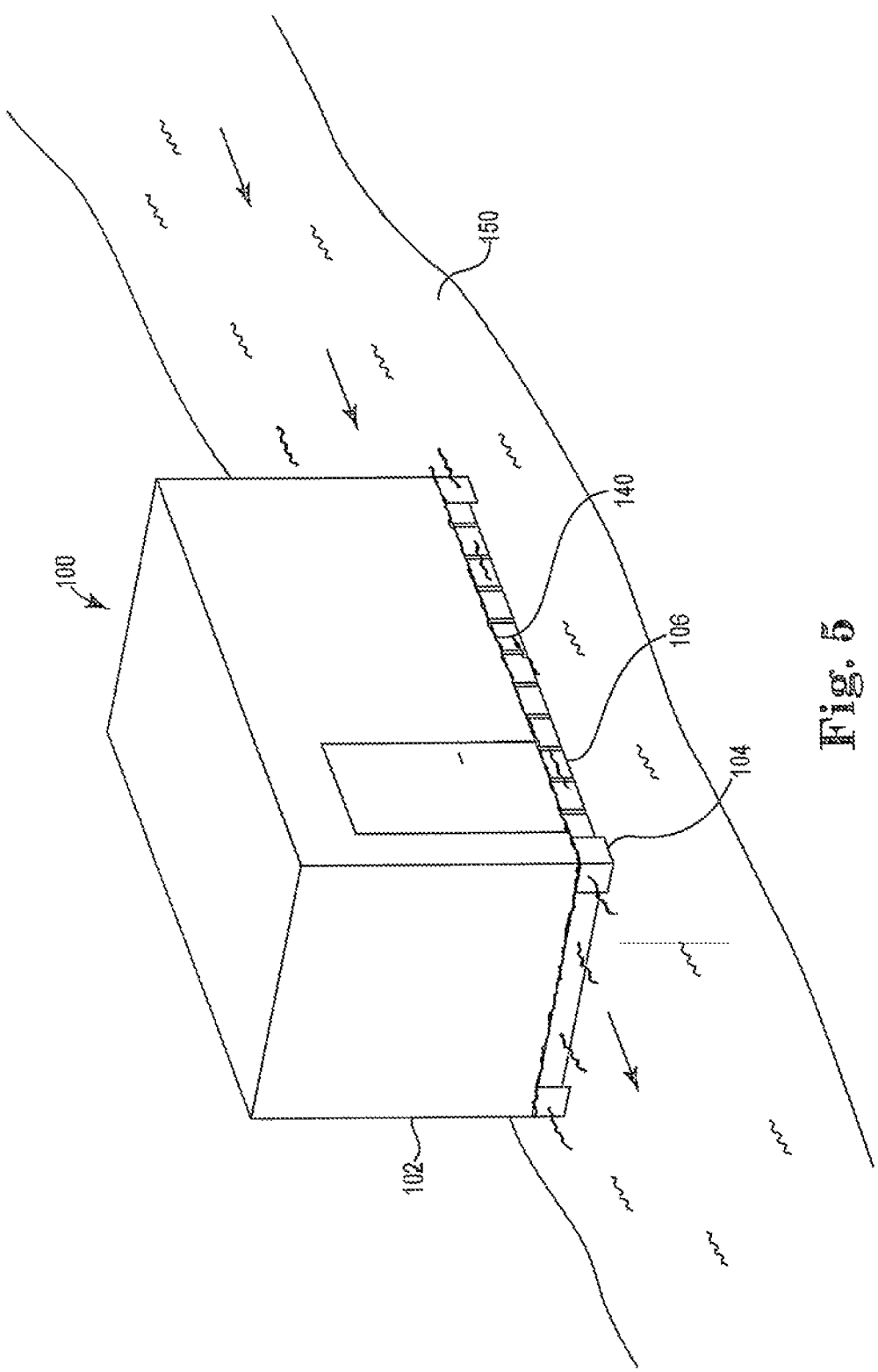
FIG. 5 is a profile view of one embodiment of a modular data center submerged in a fluid.

FIG. 5 is a profile view of one embodiment of a modular data center 100. In one embodiment, support system 104 is suitable for maintaining data center 100 at a predetermined submerged depth indicated by arrows 140 within a fluid body 150 such as a water stream or pool. In one embodiment, support system 104 provides adjustable support to maintain data center 100 at a desired submerged depth indicated by arrows 140. in one embodiment, fin side 118 of heat sinks 106 is at least partially submerged in fluid body 150. In one embodiment, fluid body 150 flows by and under the modular data center 100. As fluid body 150 flows through the fins 119 on fin side 118 of heat sinks 106, heat transfer occurs from heat sinks 106 to fluid body 150. In one illustrative suitable example embodiment, each heat sink 106 provides 10 kW of heat transfer with running water at a flow rate of 3 mph at 18° Celsius and a resulting cold plate 131 temperature reaching 21.4° Celsius. in one embodiment, the temperature rise of the flowing fluid (e.g., water) is minimal to limit environmental impact.

Modular data center 100 is deployable into a fluid body 150 such as a water stream or pool. In one embodiment, fluid body 150 is redirected from a source, manmade or natural, to flow under the modular data center 100. In one embodiment, data center 100 is deployable to a local pool system, at a customer facility, or located in a manmade tributary formed next to a river wherein the fluid level is maintained at a controlled level. An aqueduct, for example, is a suitable fluid body 150 and provides a benign environment for deploying modular data center 100. Partially submerged modular data center 100 can utilize a natural or manmade flow of fluid through the series of heat sinks 106 assembled into the bottom 112.

In one embodiment, heat sinks 106, as assembled, provide an internal cold plate for cooling for electronic IT equipment 120, such as internal computer systems. The heat generating components of electronic IT equipment 120 housed in the modular data center 100 are thermally connected to fluid body 150 via heat sinks 106 to transfer heat from the heat generating components to fluid body 150 during operation. Heat sinks 106 absorb and dissipate heat from electronic IT equipment 120 through direct thermal contact or radiant thermal contact. Heat is transferred through heat sinks 106 submerged in fluid body 150. In this manner, heat is dissipated into the surrounding environment, particularly fluid body 150 as it flows past the heat sinks 106.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A modular data center, comprising:
   a modular building structure defining an enclosure having a bottom side;
   an external support system extending from the modular building structure configured to support a weight of the modular building structure;
   a series of heat sinks assembled to the bottom side, each heat sink extending from an interior to an exterior of the enclosure and having fins protruding below the bottom side of the modular building structure into a fluid; and
   electronic equipment housed within the enclosure and thermally coupled to the series of heat sinks.

2. The data center of claim 1, wherein the series of heat sinks form a floor assembly of the modular building structure.

3. The data center of claim 1, wherein the external support system includes at least one footing extending a predetermined distance from the bottom side of the modular building structure, wherein the predetermined distance is sufficient to partially or fully submerge the fins within the fluid.

4. The data center of claim 1, wherein the external support system is adjustable.

5. The data center of claim 1, wherein the modular building structure comprises metal.

6. The data center of claim 1, comprising:
   a cold plate thermally coupled to the heat sinks forming a floor in the interior of the enclosure.

7. The data center of claim 1, wherein top surfaces of the series of heat sinks together form a cold plate in the interior of the enclosure.

8. The data center of claim 1, wherein the modular building structure is at least partially submergible.

9. The data center of claim 1, wherein the heat sinks are at least partially submergible.

10. The data center of claim 1, wherein the interior of the enclosure is waterproof.

11. A modular data center, comprising:
- a modular housing body having a bottom side with a length and a width, the modular housing body including an external structural support system extending from the bottom side, the structural support system includes weight bearing members configured to support a weight of the modular housing body;
- at least one computing system housed inside the modular housing body; and
- a heat sink flooring including rows of heat sinks extending in series along the length and width of the bottom side, the heat sinks each include a top side extending along an inside of the modular housing body and a fin side extending along an exterior of the modular housing body,
- wherein the fin side of the heat sink flooring along the bottom side of the modular housing body is submersible.

12. The modular data center of claim 11, wherein the external structural support is configured to support the modular data center at a predetermined height within a body of fluid.

13. The modular data center of claim 11, wherein the bottom side is waterproof.

14. A method of operating electronic equipment in a data center, the method comprising:
- enclosing the electronic equipment in a fluid tight modular container, wherein the modular container includes a floor having framing members;
- assembling heat sinks with the framing members to form a heat sink floor assembly, wherein a fin side of the heat sinks extend exterior of the modular container;
- supporting the modular container within a body of fluid with a support structure configured to support a weight of the modular container;
- at least partially submerging the heat sink floor assembly in the body of fluid such that the fin side of the heat sinks directly contacts the body of fluid;
- generating heat with the electronic equipment; and
- cooling the electronic equipment by heat transfer from the interior of the modular container through the heat sinks submerged in the body of fluid.

15. The method of claim 14, wherein the heat sink floor assembly is removable in sections.

16. The method of claim 14, comprising:
- fluidly sealing the heat sinks within the heat sink floor assembly.

* * * * *